(12) United States Patent
Sawada et al.

(10) Patent No.: US 10,242,875 B2
(45) Date of Patent: Mar. 26, 2019

(54) IMPURITY DIFFUSION AGENT COMPOSITION AND METHOD FOR MANUFACTURING SEMICONDUCTOR SUBSTRATE

(71) Applicant: TOKYO OHKA KOGYO CO., LTD., Kawasaki-shi (JP)

(72) Inventors: Yoshihiro Sawada, Kawasaki (JP); Yu Takahashi, Kawasaki (JP); Takuya Ohhashi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/467,586

(22) Filed: Mar. 23, 2017

(65) Prior Publication Data

US 2017/0278711 A1   Sep. 28, 2017

(30) Foreign Application Priority Data

Mar. 24, 2016 (JP) ................. 2016-059628

(51) Int. Cl.
| | |
|---|---|
| C09D 5/24 | (2006.01) |
| C09D 11/03 | (2014.01) |
| C09D 11/30 | (2014.01) |
| C09D 11/36 | (2014.01) |
| C09D 11/38 | (2014.01) |
| C09D 11/52 | (2014.01) |
| H01L 21/22 | (2006.01) |
| C09D 11/033 | (2014.01) |
| C09D 11/037 | (2014.01) |
| H01L 21/228 | (2006.01) |

(52) U.S. Cl.
CPC ............ H01L 21/228 (2013.01); C09D 5/24 (2013.01); C09D 11/03 (2013.01); C09D 11/033 (2013.01); C09D 11/037 (2013.01); C09D 11/30 (2013.01); C09D 11/36 (2013.01); C09D 11/38 (2013.01); C09D 11/52 (2013.01); H01L 21/2225 (2013.01)

(58) Field of Classification Search
None
See application file for complete search history.

(56) References Cited

U.S. PATENT DOCUMENTS

| | | | | |
|---|---|---|---|---|
| 6,623,863 B2* | 9/2003 | Kamitani | .............. | C03C 17/009 428/428 |
| 7,951,696 B2* | 5/2011 | Leung | .................. | H01L 21/228 257/E21.247 |
| 9,023,715 B2* | 5/2015 | Faul | .................. | H01L 29/66803 438/434 |
| 9,048,175 B2* | 6/2015 | Kamizono | .......... | H01L 21/2225 |
| 9,620,354 B2* | 4/2017 | Sawada | ............... | H01L 21/2225 |
| 9,831,086 B2* | 11/2017 | Sawada | .................... | H01L 31/18 |
| 9,870,924 B2* | 1/2018 | Murota | ................. | H01L 21/228 |
| 2001/0024728 A1* | 9/2001 | Kamitani | .............. | C03C 17/009 428/446 |
| 2010/0081264 A1* | 4/2010 | Leung | .................... | H01L 21/228 438/548 |
| 2013/0061922 A1* | 3/2013 | Murota | ................. | H01L 21/228 136/256 |
| 2013/0280883 A1* | 10/2013 | Faul | ..................... | H01L 21/2255 438/434 |
| 2014/0227865 A1* | 8/2014 | Kamizono | .......... | H01L 21/2225 438/562 |
| 2015/0325442 A1* | 11/2015 | Wiedmann | ............ | H01L 21/225 438/542 |
| 2016/0099149 A1* | 4/2016 | Sawada | ............... | H01L 21/2225 438/558 |
| 2016/0293425 A1* | 10/2016 | Sawada | ............... | H01L 21/2225 |
| 2016/0314975 A1* | 10/2016 | Sawada | ............... | H01L 21/2225 |
| 2017/0114454 A1* | 4/2017 | Chenevier | ......... | H01M 10/0525 |
| 2017/0278711 A1* | 9/2017 | Sawada | .................. | C09D 11/03 |
| 2017/0287714 A1* | 10/2017 | Sawada | ............... | H01L 31/18 |
| 2018/0049281 A1* | 2/2018 | Hirosawa | ................ | H01L 51/50 |
| 2018/0182624 A1* | 6/2018 | Sawada | ............... | H01L 21/2225 |

FOREIGN PATENT DOCUMENTS

| | | |
|---|---|---|
| JP | H06-318559 | 11/1994 |
| JP | 2013149820 A * | 8/2013 |
| WO | WO 2014/064873 | 9/2016 |

OTHER PUBLICATIONS

English abstract of JP2013149820, 5pgs, retrieved from the internet on Jul. 28, 2018 from https://patents.google.com/patent/JP2013149820A/en?oq=JP2013149820A.*

* cited by examiner

*Primary Examiner* — David E Graybill
(74) *Attorney, Agent, or Firm* — Knobbe Martens Olson & Bear LLP

(57) ABSTRACT

A diffusion agent composition that, even when a semiconductor substrate which is an object into which an impurity diffusion ingredient is to be diffused has, on a surface thereof, a three-dimensional structure having nano-scale fine voids on a surface thereof, can be evenly coated on the whole area of an inner surface of the fine voids, whereby boron can be diffused into the semiconductor substrate, and a method for manufacturing a semiconductor substrate using the composition. The composition includes an impurity diffusion ingredient and a hydrolyzable Si compound to produce a silanol group, the impurity diffusion ingredient containing a complex compound containing boron having a specific structure.

7 Claims, No Drawings

IMPURITY DIFFUSION AGENT COMPOSITION AND METHOD FOR MANUFACTURING SEMICONDUCTOR SUBSTRATE

RELATED APPLICATION

This application claims priority to Japanese Patent Application No. 2016-059628, filed Mar. 24, 2016, the entire content of which is incorporated herein by reference.

BACKGROUND OF THE INVENTION

Field of the Invention

The present invention relates to a diffusion agent composition comprising an impurity diffusion ingredient containing a complex compound having a specific structure containing boron and a Si compound that is hydrolyzable to produce a silanol group, and a method for manufacturing a semiconductor substrate in which an impurity diffusion ingredient is diffused into a semiconductor substrate by a thin film formed using the diffusion agent composition.

Related Art

Semiconductor substrates used in semiconductor elements such as transistors diodes and solar batteries are manufactured by diffusing impurity diffusion ingredients such as phosphorus and boron into the semiconductor substrates. For such semiconductor substrates, in the manufacture of semiconductor substrates for multigate elements such as Fin-FET and nanowire FET, in some cases, for example, impurities are diffused into semiconductor substrates having on their surface a three-dimensional structure having nanometer-scale microvoids.

For example, ion implantation (see, for example, Patent Document 1) and CVD (see, for example, Patent Document 2) are known as methods for the diffusion of an impurity diffusion ingredient into the semiconductor substrate. In the ion implantation method, an ionized impurity diffusion ingredient is implanted into a surface of a semiconductor substrate. In the CVD method, an impurity diffusion ingredient is diffused from an oxide film into a semiconductor substrate by forming an oxide film of silicon oxide or the like doped with impurity diffusion ingredients such as phosphorus and boron by CVD and then heating the semiconductor substrate with the oxide film formed thereon in an electric furnace or the like.

Patent Document 1: Japanese Unexamined Patent Application, Publication No. H06-318559
Patent Document 2: PCT International Publication No. WO2014/064873

SUMMARY OF THE INVENTION

In an ion implantation method disclosed in Patent Document 1, however, when light ions like B (boron) are implanted into a semiconductor substrate, point defects and point defect clusters are likely to be formed in areas near the surface of the substrate. For example, when CMOS elements such as CMOS image sensors are formed by diffusing an impurity diffusion ingredient into a semiconductor substrate by the ion implantation method, the occurrence of such defects is directly linked to deterioration of performance of elements.

Further, when the semiconductor substrate has on its surface a three-dimensional structure such as a nano-scale three-dimensional structure for the formation of a multigate element called Fin-FET comprising a plurality of source fins, a plurality of drain fins, and a gate vertical to these fins, in the ion implantation method, difficulties are encountered in uniformly implanting ions into a side surface and an upper surface of the fins and the gate, and the whole inner surface of concaves surrounded by the fins and the gate.

In the diffusion of the impurity diffusion ingredient by the ion implantation method into the semiconductor substrate having a nano-scale three-dimensional structure, even when ions could have been uniformly implanted, the following problem occurs. For example, when logic LSI devices and the like are formed using a semiconductor substrate having a three-dimensional pattern comprising fine fins, crystals of substrate materials such as silicon are likely to be broken by ion implantation. Such damage to the crystals is considered to cause problems of a variation in properties of the device and the occurrence of stand-by leak current.

Further, the application of the CVD method as described in Patent Document 2 poses a problem of, due to an overhang phenomenon, difficulties encountered in covering the whole inner surface of concaves surrounded by the fins and the gate with an oxide film that is uniform in thickness and contains an impurity diffusion ingredient, as well as a problem of an oxide being deposited in openings of concaves surrounded by the fins and the gate thereby blocking the openings. Thus, in the ion implantation method and the CVD method, an impurity diffusion ingredient cannot be diffused well and uniformly on semiconductor substrates without difficulties, depending upon surface shapes of the semiconductor substrate.

The present invention has been made in view of the above problems, and an object of the present invention is to provide a diffusion agent composition that, even when a semiconductor substrate which is an object into which an impurity diffusion ingredient is to be diffused has, on a surface thereof, a three-dimensional structure having nano-scale fine voids on a surface thereof, can be evenly coated on the whole area of an inner surface of the fine voids, whereby boron can be well and evenly diffused into the semiconductor substrate, and a method for manufacturing a semiconductor substrate using the diffusion agent composition.

The present inventors have found that the above problems can be solved by incorporating a complex compound containing boron having a specific structure into an impurity diffusion ingredient (A) in a diffusion agent composition comprising the impurity diffusion ingredient (A) and a Si compound (B) that is hydrolyzable to produce a silanol group, which has led to the completion of the present invention. More specifically, the present invention provides the following matters.

According to one aspect of the present invention, there is provided a diffusion agent composition comprising:
an impurity diffusion ingredient (A); and
a Si compound (B), wherein
the impurity diffusion ingredient (A) contains a complex compound represented by the following formula (a1):

wherein $R^2$ represents a group selected from a hydrogen atom and an organic group; bonding between $R^2$ and a nitrogen atom is H—N bond or C—N bond, provided that a plurality of $R^2$s may be the same or different; and $R^3$ represents a group selected from a hydrogen atom, organic groups, and halogen atoms, provided that a plurality of $R^2$s may be the same or different, and the Si compound (B) is hydrolyzable to produce a silanol group.

According to a second aspect of the present invention, there is provided a method for manufacturing a semiconductor substrate with an impurity diffusion ingredient (A) diffused thereinto, the method comprising:
coating a diffusion agent composition according to the first aspect of the present invention on a semiconductor substrate to form a coating film; and
diffusing the impurity diffusion ingredient (A) in the diffusion agent composition into the semiconductor substrate.

The present invention can provide a diffusion agent composition that, even when a semiconductor substrate which is an object into which an impurity diffusion ingredient is to be diffused has, on a surface thereof, a three-dimensional structure having nano-scale fine voids on a surface thereof, can be evenly coated on the whole area of an inner surface of the fine voids, whereby boron can be well and evenly diffused into the semiconductor substrate, and a method for manufacturing a semiconductor substrate using the diffusion agent composition.

DETAILED DESCRIPTION OF THE INVENTION

<<Diffusion Agent Composition>>

The diffusion agent composition contains an impurity diffusion ingredient (A) and a Si compound (B) that can be hydrolyzed to produce a silanol group. The impurity diffusion ingredient (A) contains a complex compound represented by a formula (a1) that will be described later. Boron can be well diffused into a semiconductor substrate using a diffusion agent composition by using the impurity diffusion ingredient (A). Even when a semiconductor substrate which is an object into which an impurity diffusion ingredient is to be diffused has, on a surface thereof, a three-dimensional structure having nano-scale fine voids on a surface thereof, the use of the Si compound (B) can allow the diffusion agent composition to be evenly coated on a surface of the semiconductor substrate including the whole area of an inner surface of fine voids. This allows boron to be evenly diffused into the semiconductor substrate. A plurality of $R^3$s may be the same or different.

Indispensable or optional ingredients contained in the diffusion agent composition will be described.

[Impurity Diffusion Ingredient (A)]

The impurity diffusion ingredient (A) is an ingredient that diffuses boron element as an impurity into the semiconductor substrate. The impurity diffusion ingredient (A) contains a complex compound represented by the following formula (a1).

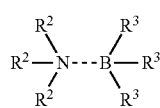

(a1)

$R^2$ represents a group selected from a hydrogen atom and an organic group; bonding between $R^2$ and a nitrogen atom is H—N bond or C—N bond, provided that a plurality of $R^2$s may be the same or different; and $R^3$ represents a group selected from a hydrogen atom, organic groups, and halogen atoms, provided that a plurality of $R^3$s may be the same or different.

$R^2$ represents a group selected from a hydrogen atom and organic groups. A plurality of $R^2$s may be the same or different, preferably are the same.

Examples of $R^2$ that represents an organic group include optionally substituted alkyl groups, optionally substituted cycloalkyl groups, optionally substituted aryl groups, optionally substituted acyl groups, and optionally substituted aralkyl groups.

When $R^2$ represents an alkyl group, the alkyl group may be of a straight chain type or a branched chain type. The number of carbon atoms in the alkyl group is not particularly limited but is preferably 1 to 20, preferably 1 to 10, particularly preferably 1 to 6.

Examples of suitable alkyl groups include methyl, ethyl, n-propyl, isopropyl, n-butyl, isobutyl, sec-butyl, tert-butyl, n-pentyl, isopentyl, neopentyl, tert-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, n-nonadecyl, and n-icosyl groups.

The type of substituents that may be possessed by the alkyl group is not particularly limited as long as the object of the present invention is not impaired. Examples of substitutes that may be possessed by the alkyl group include alkoxy groups having 1 to 6 carbon atoms, a hydroxyl group, a mercapto group, a cyano group, aliphatic acyloxy groups having 1 to 6 carbon groups, a benzoyl group, and halogen atoms. When the alkyl group has a plurality of substituents, the plurality of substituents may be the same or different.

Examples of suitable substituted alkyl groups include alkoxyalkyl groups such as 2-methoxyethyl, 3-methoxy-n-propyl, 4-methoxy-n-butyl, 5-methoxy-n-pentyl, 6-methoxy-n-hexyl, 2-ethoxyethyl, 3-ethoxy-n-propyl, 4-ethoxy-n-butyl, 5-ethoxy-n-pentyl, and 6-ethoxy-n-hexyl groups; hydroxyalkyl groups such as 2-hydroxyethyl, 3-hydroxy-n-propyl, 4-hydroxy-n-butyl, 5-hydroxy-n-pentyl, and 6-hydroxy-n-hexyl groups; mercaptoalkyl groups such as 2-mercaptoethyl, 3-mercapto-n-propyl, 4-mercapto-n-butyl, 5-mercapto-n-pentyl, and 6-mercapto-n-hexyl groups; cyanoalkyl groups such as 2-cyanoethyl group, 3-cyano-n-propyl, 4-cyano-n-butyl, 5-cyano-n-pentyl, and 6-cyano-n-hexyl groups; acyloxyalkyl groups such as 2-acetoxyethyl, 3-acetoxy-n-propyl, 4-acetoxy-n-butyl, 5-acetoxy-n-pentyl, 6-acetoxy-n-hexyl, 2-propionyloxyethyl, 3-propionyloxy-n-propyl, 4-propionyloxy-n-butyl, 5-propionyloxy-n-pentyl, and 6-propionyloxy-n-hexyl groups; and halogenated alkyl groups such as chloromethyl, dichloromethyl, trichloromethyl, 2-chloroethyl, 3-chloro-n-propyl, 4-chloro-n-butyl, 5-chloro-n-pentyl, 6-chloro-n-hexyl, bromomethyl, dibromomethyl, tribromomethyl, 2-bromoethyl, 3-bromo-n-propyl, 4-bromo-n-butyl, 5-bromo-n-pentyl, 6-bromo-n-hexyl, trifluoromethyl, pentafluoroethyl, 2,2,2-trifluoroethyl, heptafluoro-n-propyl, 3,3,3-trifluoropropyl, and 3,3,4,4,5,5,5-heptafluoro-n-pentyl groups.

When $R^2$ represents the cycloalkyl group, the number of carbon atoms in the cycloalkyl group is not particularly limited but is preferably 3 to 10, more preferably 3 to 8. Examples of suitable cycloalkyl groups include cyclopropyl, cyclobutyl, cyclopentyl, cyclohexyl, cycloheptyl, and cyclooctyl groups. Examples of suitable substituents that may be possessed by the cycloalkyl group are the same as those described in connection with those in the alkyl group.

When $R^2$ represents an aryl group, the aryl group may be an aromatic hydrocarbon group or an aromatic heterocyclic group, preferably an aromatic hydrocarbon group. The number of carbon atoms in the aryl group is preferably 6 to 20, more preferably 6 to 10. Examples of suitable aryl groups include phenyl, naphthyl, biphenylyl, anthryl, and phenantolyl groups.

Examples of suitable substituents that may be possessed by the aryl group include alkyl groups having 1 to 6 carbon atoms, alkoxy groups having 1 to 6 carbon atoms, a hydroxyl group, a mercapto group, a cyano group, aliphatic acyloxy groups having 2 to 7 carbon atoms, a benzoyl group, alkoxycarbonyl groups having 2 to 7 carbon atoms, a phenoxycarbonyl group, a nitro group, a nitroso group, and halogen atoms. When the alkyl group has a plurality of substituents, the plurality of substituents may be the same or different.

When $R^2$ represents an acyl group, the acyl group may be an aliphatic acyl group, an aromatic acyl group, or an acyl group containing a combination of an aliphatic group with an aromatic group. When $R^2$ represents an aliphatic acyl group, the aliphatic acyl group may be of a straight chain type or a branched chain type. When $R^2$ represents an aromatic acyl group, the aromatic group containing the aromatic acyl group may be an aromatic hydrocarbon group or an aromatic heterocyclic group, preferably an aromatic hydrocarbon group.

When $R^2$ represents an aliphatic acyl group, the number of carbon atoms in the aliphatic acyl group is preferably 2 to 20, more preferably 2 to 10, particularly preferably 2 to 7. When $R^2$ represents an aromatic acyl group, the number of carbon atoms in the aromatic acyl group is preferably 7 to 20, more preferably 7 to 11.

Examples of suitable aliphatic acyl groups include acetyl, propionyl, n-butanoyl, n-pentanoyl, n-hexanoyl, and n-heptanoyl groups. Examples of suitable aromatic acyl groups include benzoyl, α-naphthoyl, and β-naphthoyl groups.

When $R^2$ represents an aliphatic acyl group, substituents that may be possessed by the aliphatic acyl group are the same as those in the case where $R^2$ represents an alkyl group. When $R^2$ represents an aromatic acyl group, substituents that may be possessed by the aromatic acyl group are the same as those in the case where $R^2$ represents an aryl group. When the acyl group has a plurality of substituents, the plurality of substituents may be the same or different.

When $R^2$ represents an aralkyl group, the aromatic group contained in the aralkyl group may be a hydrocarbon group or an aromatic heterocyclic group, preferably an aromatic hydrocarbon group. When $R^2$ represents an aralkyl group, the number of carbon atoms in the aralkyl group is preferably 7 to 20, more preferably 7 to 11.

Examples of suitable aralkyl group include benzyl, phenetyl, α-naphthylmethyl, β-naphthylmethyl, 2-α-naphthylethyl, and 2-β-naphthylethyl groups.

When $R^2$ represents an aralkyl group, substituents that may be possessed by the aliphatic group contained in the aralkyl group are the same as those in the case where $R^2$ represents an alkyl group. When $R^2$ represents an aralkyl group, substituents that may be possessed by the aromatic group in the aralkyl group are the same as those in the case where $R^2$ represents an aryl group. When the aralkyl group has a plurality of substituents, the plurality of substituents may be the same or different.

$R^3$ is a group selected from a hydrogen atom, organic groups, and halogen atoms. A plurality of $R^2$s may be the same or different, preferably are the same.

When $R^3$ represents an organic group, examples of suitable organic groups are the same as those described in connection with $R^2$. When $R^3$ represents a halogen atom, fluorine, chlorine, bromine, and iodine atoms may be mentioned as the halogen atom.

Among the complex compounds represented by the formula (a1), complex compounds represented by the formula (a1) wherein all the $R^2$s represent an optionally substituted alkyl group having 1 to 6 carbon atoms are preferred, and complex compounds represented by the formula (a1) wherein all the $R^2$s represent an unsubstituted alkyl group having 1 to 6 carbon atoms are more preferred. Among the complex compounds represented by the formula (a1), complex compounds represented by the formula (a1) wherein all the $R^3$s represent a hydrogen atom are preferred. For this reason, among the complex compounds represented by the formula (a1), complex compounds represented by the formula (a1) wherein all the $R^2$s represent an optionally substituted alkyl group having 1 to 6 carbon atoms and all the $R^3$s represent a hydrogen atom are particularly preferred, and complex compounds represented by the formula (a1) wherein all the $R^2$s represent an unsubstituted alkyl group having 1 to 6 carbon atoms and all the $R^3$s represent a hydrogen atom are most preferred The impurity diffusion ingredient (A) may contain a boron compound other than the complex compounds represented by the formula (a1). Preferred boron compounds include boric acid, metaboric acid, boronic acid, perboric acid, hypoboric acid, diboron trioxide, trialkylborane, and trialkyl borate. Specific examples of suitable boron compounds include trimethyl borate, triethyl borate, tri-n-propyl borate, tri-n-butyl borate, trimethylboron, triethylboron, tri-n-propylboron, and tri-n-butylboron.

When the impurity diffusion ingredient (A) contains a the complex compounds represented by the formula (a1) and a boron compound moiety other than the complex compounds represented by the formula (a1), the content of the complex compound represented by the formula (a1) in the impurity diffusion ingredient is preferably not less than 10% by mole, more preferably not less than 20% by mole, on the presumption that the total amount of the impurity diffusion ingredient (A) is presumed to be 100% by mole.

The content of the impurity diffusion ingredient (A) in the diffusion agent composition is not particularly limited. For the content of the impurity diffusion ingredient (A) in the diffusion agent composition, the amount (moles) of a boron element contained in the impurity diffusion ingredient (A) is preferably 0.01 to 5 times, more preferably 0.05 to 3 times, the number of moles of Si contained in the hydrolyzable silane compound (B).

[Hydrolyzable Silane Compound (B)]

The diffusion agent composition contains a hydrolyzable silane compound (B). By virtue of this constitution, when the diffusion agent composition is applied onto a semiconductor substrate to form a thin film, the hydrolyzable silane compound is subjected to hydrolysis condensation to form a silicon oxide-based very thin film within the coating film. When the silicon oxide-based very thin film is formed within the coating film, external diffusion of the impurity diffusion ingredient (A) on the outside of the substrate is suppressed. In this case, even when the film of the diffusion agent composition is a thin film, the impurity diffusion ingredient (A) is diffused well and uniformly into the semiconductor substrate.

The hydrolyzable silane compound (B) produces a hydroxyl group as a result of hydrolysis and has a functional group bondable to a Si atom. Functional groups that produce a hydroxyl group as a result of hydrolysis include alkoxy, isocyanate, and dimethylamino groups and halogen atoms.

Straight-chain or branched-chain aliphatic alkoxy groups having 1 to 5 carbon atoms are preferred as the alkoxy group. Specific examples of suitable alkoxy groups include methoxy, ethoxy, n-propoxy, isopropoxy, and n-butoxy groups. Preferred halogen atoms are chlorine, fluorine, bromine, and iodine atoms, and the chlorine atom is more preferred.

The functional group that produces a hydroxyl group as a result of hydrolysis is preferably an isocyanate group and straight-chain or branched-chain aliphatic alkoxy group having 1 to 5 carbon atoms, more preferably methoxy, ethoxy, and isocyanate groups, from the viewpoints of rapid hydrolysis and handleability and availability of the hydrolyzable silane compound (B).

Specific examples of the hydrolyzable silane compound (B) having a straight-chain or branched-chain aliphatic alkoxy groups having 1 to 5 carbon atoms include tetramethoxysilane, tetraethoxysilane, tetra-n-propoxysilane, tetraisopropoxysilane, tetra-n-butoxysilane, tetra-n-pentyloxysilane, trimethoxymonoethoxysilane, dimethoxydiethoxysilane, monomethoxytriethoxysilane, trimethoxymono-n-propoxysilane, dimethoxydi-n-propoxysilane, monomethoxytri-n-propoxysilane, trimethoxy mono-n-butoxysilane, dimethoxydi-n-butoxysilane, monomethoxytri-n-tributoxysilane, trimethoxymono-n-pentyloxysilane, dimethoxydi-n-pentyloxysilane, monomethoxytri-n-pentyloxysilane, triethoxymono-n-propoxysilane, diethoxydi-n-propoxysilane, monoethoxytri-n-propoxysilane, triethoxymono-n-butoxysilane, diethoxydi-n-butoxysilane, monoethoxytri-n-butoxysilane, triethoxymono-n-pentyloxysilane, diethoxydi-n-pentyloxysilane, monoethoxytri-n-pentyloxysilane, tri-n-propoxymono-n-butoxysilane, di-n-propoxydi-n-butoxysilane, mono-n-propoxytri-n-propoxysilane, tri-n-propoxy mono-n-pentyloxysilane, di-n-propoxydi-n-pentyloxysilane, mono-n-propoxytri-n-pentyloxysilane, tri-n-butoxy mono-n-pentyloxysilane, di-n-butoxydi-n-pentyloxysilane, mono-n-butoxytri-n-pentyloxysilane, methyltrimethoxysilane, methyltriethoxysilane, methyltri-n-propoxysilane, methyltri-n-propoxysilane, methyltri-n-butoxysilane, methyltri-n-pentyloxysilane, ethyltrimethoxysilane, ethyltriethoxysilane, ethyltri-n-propoxysilane, ethyltri-n-butoxysilane, and ethyltri-n-pentyloxysilane. These hydrolyzable silane compounds (B) may be used solely or in a combination of two or more of these. Further, partial hydrolyzates of the alkoxysilane compounds may also be used as the hydrolyzable silane compound (B).

Among these, tetramethoxysilane, tetraethoxysilane, methyltrimethoxysilane, methyltriethoxysilane, ethyltrimethoxysilane, and ethyltriethoxysilane are preferred, and tetramethoxysilane and tetraethoxysilane are particularly preferred.

Compounds represented by the following formula (b1) are preferred as the isocyanate-group-containing hydrolyzable silane compound (B).

$(R^1)_{4-n}Si(NCO)_n$             (b1)

$R^1$ represents a hydrocarbon group; and n is an integer of 3 or 4.

The hydrocarbon group as $R^1$ in the formula (b1) is not particularly limited as long as the object of the present invention is not impeded. Preferably, $R^1$ represents an aliphatic hydrocarbon group having 1 to 12 carbon atoms, an aromatic hydrocarbon group having 1 to 12 carbon atoms, or an aralkyl group having 1 to 12 carbon atoms.

Examples of suitable aliphatic hydrocarbon groups having 1 to 12 carbon atoms include methyl, ethyl, n-propyl, isopropyl, n-butyl, sec-butyl, isobutyl, tert-butyl, n-pentyl, isopentyl, neopentyl, cyclopentyl, n-hexyl, cyclohexyl, n-heptyl, cycloheptyl, n-octyl, cyclooctyl, n-nonyl, n-decyl, n-undecyl, and n-dodecyl groups.

Examples of suitable aromatic hydrocarbon groups having 1 to 12 carbon atoms include phenyl, 2-methylphenyl, 3-methylphenyl, 4-methylphenyl, 2-ethylphenyl, 3-ethylphenyl, 4-ethylphenyl, α-naphthyl, β-naphthyl, and biphenylyl groups.

Examples of suitable aralkyl groups having 1 to 12 carbon atoms include benzyl, phenetyl, α-naphthylmethyl, β-naphthylmethyl, 2-α-naphthylethyl, and 2-β-naphthylethyl groups.

Among the above-described hydrocarbon atoms, methyl and ethyl groups are preferred, and a methyl group is more preferred.

Among the hydrolyzable silane compounds (B) represented by the formula (b1), tetraisocyanatesilane, methyltriisocyanatesilane, and ethyltriisocyanatesilane are preferred, and tetraisocyanatesilane is more preferred.

The hydrolyzable silane compound (B) containing an isocyanate group and the hydrolyzable silane compound (B) containing a straight-chain or branched-chain aliphatic alkoxy group having 1 to 5 carbon atoms may also be used in combination. In this case, the ratio X/Y between the number of moles X of the hydrolyzable silane compound (B) containing an isocyanate group and the number of moles Y of the hydrolyzable silane compound (B) containing a straight-chain or branched-chain aliphatic alkoxy group having 1 to 5 carbon atoms is preferably 1/99 to 99/1, more preferably 50/50 to 95/5, particularly preferably 60/40 to 90/10.

The content of the hydrolyzable silane compound (B) in the diffusion agent composition is preferably 0.001 to 3.0% by mass, more preferably 0.01 to 1.0% by mass, in terms of Si concentration. When the diffusion agent composition contains the hydrolyzable silane compound (B) at this concentration, external diffusion of the impurity diffusion ingredient (A) from the thin coating film formed using the diffusion agent composition can be well suppressed, and the impurity diffusion ingredient can be diffused well and uniformly into the semiconductor substrate.

[Organic Solvent (S)]

The diffusion agent composition usually contains an organic solvent (S) as a solvent so that a thin coating film can be formed. The type of the organic solvent (S) is not particularly limited as long as the object of the present invention is not impeded.

The diffusion agent composition contains the hydrolyzable silane compound (B) and thus is preferably substantially free from water. The expression "the diffusion agent composition is preferably substantially free from water" means that the diffusion agent composition does not contain water in such an amount that the hydrolysis proceeds to a level that impedes the object of the present invention.

Specific examples of organic solvents (S) include: mono ethers of glycols such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monophenyl ether, dipropylene glycol monomethyl ether, dipropylene glycol monoethyl ether, dipropylene glycol monopropyl ether, dipropylene glycol monobutyl ether, dipropylene glycol monophenyl ether, triethylene glycol monomethyl ether, triethylene glycol monoethyl ether, tripropylene glycol monomethyl ether, and tripropylene glycol monoethyl ether; monoethers such as diisopentyl ether, diisobutyl ether, benzyl methyl ether, benzyl ethyl ether, dioxane, tetrahydrofuran, anisole, perfluoro-2-butyltetrahydrofuran, and perfluorotetrahydrofuran; chain diethers of glycols such as ethylene glycol dimethyl ether, ethylene glycol diethyl ether, ethylene ethylene glycol dipropyl ether, ethylene glycol dibutyl ether, propylene glycol dimethyl ether, propylene glycol diethyl ether, propylene glycol dipropyl ether, propylene glycol dibutyl ether, diethylene glycol dimethyl ether, diethylene glycol diethyl ether, diethylene glycol dipropyl ether, diethylene glycol dibutyl ether, dipropylene glycol dimethyl ether, dipropylene glycol diethyl ether, dipropylene glycol dipropyl ether, and dipropylene glycol dibutyl ether; cyclodiethers such as 1,4-dioxane; ketones such as 1-octanone, 2-octanone, 1-nonanone, 2-nonanone, acetone, 2-heptanone, 4-heptanone, 1-hexanone, 2-hexanone, 3-pentanone, diisobutyl ketone, cyclohexanone, methylcyclohexanone, phenylacetone, methylethyl ketone, methylisobutyl ketone, ethylisobutyl ketone, acetylacetone, acetonylacetone, ionone, diacetonyl alcohol, acetyl carbinol, acetophenone, methyl naphthyl ketone, and isophorone; esters such as methyl acetate, butyl acetate, ethyl acetate, isopropyl acetate, pentyl acetate, isopentyl acetate, methoxy ethyl acetate, ethoxy ethyl acetate, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, propylene glycol monomethyl ether acetate, propylene glycol monoethyl ether acetate, propylene glycol monopropyl ether acetate, propylene glycol monobutyl ether acetate, propylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl carbonate, propyl carbonate, butyl carbonate, methylpyrubate, ethylpyrubate, propylpyrubate, butyl pyrubate, methyl acetoacetate, ethyl acetoacetate, methyl propionate, ethyl propionate, propyl propionate, isopropyl propionate, methyl-3-methoxypropionate, ethyl-3-methoxypropionate, ethyl-3-ethoxypropionate, propyl-3-methoxy propionate, and isopropyl-3-methoxypropionate, propylene carbonate, and γ-butyrolactone; amide-based solvents containing no active hydrogen atom, such as N-methyl-2-pyrrolidone, N,N-dimethylacetamide, N,N-dimethylformamide, hexamethylphosphoric triamide, and 1,3-dimethyl-2-imidazolidinone; sulfoxides such as dimethyl sulfoxide; aliphatic hydrocarbon-based solvents optionally containing a halogen atom such as pentane, hexane, octane, decane, 2,2,4-trimethylpentane, 2,2,3-trimethylhexane, perfluorohexane, perfluoroheptane, limonene, and pinene; aromatic hydrocarbon-based solvents such as benzene, toluene, xylene, ethylbenzene, propylbenzene, 1-methylpropylbenzene, 2-methylpropylbenzene, diethylbenzene, ethylmethylbenzene, trimethylbenzene, ethyldimethylbenzene, and dipropylbenzene; monovalent alcohols such as methanol, ethanol, n-propanol, isopropanol, butanol, isobutanol, 2-methoxyethanol, 2-ethoxyethanol, 3-methyl-3-methoxybutanol, hexanol, cyclohexanol, benzyl alcohol, and 2-phenoxyethanol; and glycols such as ethylene glycol, propylene glycol, diethylene glycol, and dipropylene glycol. In the above examples of preferred organic solvent (S), organic solvents containing an ether bond and an ester bond are classified in esters. They may be used solely or in a combination of two or more of these.

Since the diffusion agent composition contains the hydrolyzable silane compound (B), preferably the (S) organic solvent does not have a functional group reactive with the hydrolyzable silane compound (B). In particular, when the hydrolyzable silane compound (B) contains an isocyanate group, preferably the (S) solvent does not have a functional group reactive with the hydrolyzable silane compound (B).

Functional groups reactive with the hydrolyzable silane compound (B) include both functional groups reactive directly with groups that are hydrolyzable to produce a hydroxyl group, and functional groups reactive with a hydroxyl group (a silanol group) produced by hydrolysis. Examples of functional groups reactive with the hydrolyzable silane compound (B) include a hydroxyl group, a carboxyl group, an amino group, and halogen atoms.

Examples of suitable organic solvents that do not have a functional group reactive with the hydrolyzable silane compound (B) include, among the specific examples of the organic solvent (S), monoethers, chain diethers, ketones, esters, amide-based solvents that do not have an active hydrogen atom, sulfoxides, and aliphatic hydrocarbon-based solvents that may contain a halogen, and organic solvent recited as specific examples of aromatic hydrocarbon-based solvents.

[Other Ingredients]

The diffusion agent composition may contain various additives such as surfactants, antifoaming agents, pH adjustors, and viscosity modifiers as long as the object of the present invention is not impaired. Further, the diffusion agent composition may contain binder resins with a view to improving the coatability and film forming properties. Various resins may be used as the binder resin, and acrylic resins are preferred.

The diffusion agent composition is obtained by homogeneously mixing the above ingredients in respective predetermined amounts.

<<Method for Manufacturing Semiconductor Substrate>>

The method for manufacturing a semiconductor substrate comprises:

coating the diffusion agent composition to form a coating film; and diffusing the impurity diffusion ingredient (A) in the diffusion agent composition into a semiconductor substrate. The step of forming a coating film is referred to also as a "coating step," and the step of diffusing the impurity diffusion ingredient (A) into the semiconductor substrate is referred to also as a "diffusion step". The coating step and the diffusion step will be described in that order.

[Coating Step]

In the coating step, a diffusion agent composition is coated on a semiconductor substrate to form a coating film. Regarding the coating step, the semiconductor substrate and the coating method will be described in that order.

Semiconductor Substrate

Various substrates that have hitherto been used as a target of diffusion of an impurity diffusion ingredient may be used as the semiconductor substrate without limitation. Silicon substrates are typically used as the semiconductor substrate. Since the impurity diffusion ingredient contained in the diffusion agent composition contains boron, an n-type silicon substrate is suitable as the silicon substrate.

The semiconductor substrate may have a three-dimensional structure on its surface onto which the diffusion agent composition is to be applied. According to the present invention, even when the semiconductor substrate has on its surface the three-dimensional structure, particularly a three-dimensional structure having a nano-scale micropattern, the impurity diffusion ingredient can be diffused well and uniformly into the semiconductor substrate by coating the diffusion agent composition to form a thin coating film having a thickness of not more than e.g. 30 nm on the semiconductor substrate.

The shape of the pattern is not particularly limited, however typical examples thereof include linear or curved lines or grooves of a rectangular cross section and hole shapes formed by removing a circular or rectangular cylindrical shape.

When the semiconductor substrate has on its surface a repeating pattern of a plurality of parallel lines as the three-dimensional structure, an interval between the lines may be not more than 60 nm, not more than 40 nm, or not more than 20 nm. The height of the lines may be not less than 30 nm, not less than 50 nm, or not less than 100 nm.

Coating Method

The thickness of the coating film formed using the diffusion agent composition is not particularly limited. The diffusion agent composition is applied onto the semiconductor substrate so that the thickness of the coating film formed using the diffusion agent composition is not more than 30 nm, preferably 0.2 to 10 nm. The method for coating the diffusion agent composition is not particularly limited as long as a coating film having a desired thickness can be formed. Preferred coating methods for the diffusion agent composition include spin coating, ink jet coating, and spray coating. The thickness of the coating film is an average of thickness values measured at five or more points with an ellipsometer.

The thickness of the coating film is properly set to any desired thickness depending upon the shape of the semiconductor substrate and an arbitrarily determined degree of diffusion of the impurity diffusion ingredient (A).

After the application of the diffusion agent composition onto the surface of the semiconductor substrate, the surface of the semiconductor substrate is preferably rinsed with an organic solvent. The thickness of the coating film can be made further uniform by rinsing the surface of the semiconductor substrate after the formation of the coating film. In particular, when the semiconductor substrate has on its surface a three-dimensional structure, the thickness of the coating film is likely to be thick at the bottom (stepped portion) of the three-dimensional structure. However, the thickness of the coating film can be made uniform by rinsing the surface of the semiconductor substrate after the formation of the coating film.

Organic solvents that may be contained in the diffusion agent composition may be used as the organic solvent for rinsing.

[Diffusion Step]

In the diffusion step, the impurity diffusion ingredient (A) contained in the thin coating film formed on the semiconductor substrate using the diffusion agent composition is diffused into the semiconductor substrate. Any method may be used without particular limitation for the diffusion of the impurity diffusion ingredient (A) into the semiconductor substrate as long as the impurity diffusion ingredient (A) can be diffused from the coating film formed of the diffusion agent composition by heating.

A typical method is to heat a semiconductor substrate with a coating film of a diffusion agent composition formed thereon in a heating furnace such as an electric furnace. Conditions for heating are not particularly limited as long as the impurity diffusion ingredient is diffused to a desired extent.

In general, after the removal of organic materials in the coating film by firing under an atmosphere of an oxidizing gas, the semiconductor substrate is heated under an atmosphere of an inert gas to diffuse the impurity diffusion ingredient into the semiconductor substrate. Heating for the removal of the organic materials by firing is preferably carried out at a temperature of approximately 300 to 1000° C., more preferably 400 to 800° C., preferably for 1 to 120 min, more preferably for 5 to 60 min. Heating for the diffusion of the impurity diffusion ingredient is preferably carried out at 800 to 1400° C., more preferably at 800 to 1200° C., preferably for 1 to 120 min, more preferably for 5 to 60 min.

When the temperature of the semiconductor substrate can be rapidly raised at 25° C./sec or more to a predetermined diffusion temperature, the holding time of the diffusion temperature may be not more than 30 sec, not more than 10 sec, or even a very short time of less than 1 sec. In this case, the impurity diffusion ingredient can easily be diffused at a high concentration in a shallow region in the surface of the semiconductor substrate.

According to the method described above, even when a semiconductor substrate having on its surface a three-dimensional structure with nano-scale microvoids is used, the impurity diffusion ingredient can be diffused well and uniformly into the semiconductor substrate while suppressing the occurrence of defects. Accordingly, the method according to the present invention is suitable for use in the manufacture of multigate elements having a three-dimensional microstructure. The method according to the present invention can suppress the occurrence of defects in the semiconductor substrate during the diffusion of the impurity diffusion ingredient and thus is particularly suitable for use in the manufacture of CMOS elements such as CMOS image sensors, logic LSI devices.

EXAMPLES

The following Examples further illustrate the present invention but should not be construed as limiting the present invention.

Examples 1 to 8 and Reference Example 1

An impurity diffusion ingredient (ingredient (A)) and a Si compound that is hydrolyzable to produce a silanol group (ingredient (B)) of the types specified in Table 1 were dissolved in n-butyl acetate so that the content of the ingredient (A) and the content of the ingredient (B) in the diffusion agent composition were those (% by mass) specified in Table 1, thereby obtaining diffusion agent compositions used in the Examples and the Reference Examples. In Table 1, for the ingredient (A), I relates to a complex compound represented by the formula (a1), and II relates to a boron compound other than the complex compounds represented by the formula (a1).

The ingredient (A) and the ingredient (B) specified in Table 1 were as follows.

(Ingredient (A))

A1: triethylamineborane (a complex compound represented by the formula (a1) wherein three $R^2$s represent an ethyl group; and three $R^3$s represent a hydrogen atom).
A2: trimethyl borate
A3: tri-n-butyl borate (Ingredient (B))
B1: tetraisocyanatesilane
B2: methyltriisocyanatesilane Diffusion agent compositions of the Examples and the Reference Examples were coated on a surface of a silicon substrate having a flat surface (6 inches, n-type) with a spin coater to form coating films having thicknesses specified in Table 1. After coating, the coating films were rinsed with n-butyl except for the use of the diffusion agent composition of Example 8.

After the formation of the coating film, the impurity diffusion ingredient was subjected to diffusion treatment by the following method. At the outset, the coating films were baked on a hot plate. Subsequently, the baked coating films were heated at a temperature rise rate of 25° C./sec under a nitrogen atmosphere (flow rate 1 L/m) with a rapid thermal annealing apparatus (a lamp annealing apparatus) to conduct diffusion treatment at a diffusion temperature and a diffusion time specified in Table 1. The starting point of the diffusion time is a point of time when the temperature of the substrate has reached the diffusion temperature. After the completion of the diffusion, the semiconductor substrate was rapidly cooled to room temperature.

As a result of the diffusion treatment of the impurity diffusion ingredient, for all the semiconductor substrates after the test, the type was reversed from n-type to p-type. For the substrates subjected to impurity diffusion treatment, the sheet resistance was measured. The results of measurement of the sheet resistance are illustrated in Table 1.

TABLE 1

| | Ingredients in the impurity diffusion agent composition | | | | | | | | | |
|---|---|---|---|---|---|---|---|---|---|---|
| | (A) | | | | (B) | | | Diffusion | | |
| | I | | II | | | | Thickness of | condition | | Sheet |
| | Type/ % by mass | B/Si mass ratio | Type/ % by mass | B/Si mass ratio | Type/ % by mass | B/Si molar ratio | coating film nm | Temp. ° C. | Time Sec. | resistance Ω/sq. |
| Example 1 | A1/ 0.800 | 0.75 | — | — | B1/ 0.700 | 1.95 | 11.7 | 1200 | 15 | 1400 |
| Example 2 | A1/ 0.088 | 0.25 | A2/ 0.237 | 0.75 | B1/ 0.230 | 2.60 | 1.2 | 1100 | 10 | 12940 |
| | | | | | | | | 1150 | 10 | 6907 |
| | | | | | | | 2.5 | 1100 | 10 | 7054 |
| | | | | | | | | 1150 | 10 | 3869 |
| | | | | | | | 2.7 | 1050 | 10 | 12450 |
| | | | | | | | | 1100 | 10 | 8940 |
| | | | | | | | | 1150 | 10 | 3870 |
| | | | | | | | 3.1 | 1100 | 10 | 10350 |
| | | | | | | | | 1150 | 10 | 6815 |
| | | | | | | | | 1200 | 15 | 2446 |
| Example 3 | A1/ 0.053 | 0.15 | A2 0.237 | 0.75 | B1/ 0.230 | 2.34 | 2.5 | 1100 | 10 | 16370 |
| | | | | | | | | 1150 | 10 | 8113 |
| Example 4 | A1/ 0.088 | 0.25 | A3/ 0.526 | 0.75 | B1/ 0.230 | 2.60 | 3.6 | 1100 | 10 | 11860 |
| | | | | | | | | 1150 | 10 | 6792 |
| Example 5 | A1/ 0.088 | 0.25 | A2/ 0.158 | 0.50 | B2/ 0.230 | 1.95 | 3.2 | 1100 | 10 | 7585 |
| | | | | | | | | 1150 | 10 | 7002 |
| | | | | | | | | 1200 | 15 | 3124 |
| Example 6 | A1/ 0.088 | 0.25 | A2/ 0.316 | 1.00 | B1 0.230 | 3.25 | 3.4 | 1100 | 10 | 12170 |
| | | | | | | | | 1150 | 10 | 7311 |
| | | | | | | | | 1200 | 15 | 2269 |
| Example 7 | A1/ 0.175 | 0.50 | A2/ 0.158 | 0.50 | B1 0.230 | 3.25 | 2.5 | 1100 | 10 | 8375 |
| | | | | | | | | 1150 | 10 | 3439 |
| Example 8 | A1/ 0.088 | 0.25 | A2 0.237 | 0.75 | B2/ 0.198 | 2.60 | 1.7 | 1100 | 10 | 16120 |
| | | | | | | | | 1150 | 10 | 3115 |
| Reference example 1 | — | — | A2/ 1.080 | 0.75 | B1/ 1.050 | 1.95 | 17.4 | 1100 | 10 | 5376 |

Table 1 demonstrates that, even when the diffusion agent composition of Reference Example 1 containing trimethyl borate as the impurity diffusion ingredient is used, the impurity can be well diffused and that, when the diffusion agent compositions of Examples 1 to 8 that contain triethylamineborane corresponding to the complex compound represented by the formula (a1) as the impurity diffusion ingredient is used, the impurity can be diffused better.

From the test for Example 2 where the thickness of the coating film was 1.2 nm and the test for Example 8 where the thickness of the coating film was 1.7 nm, it is apparent that the use of diffusion agent compositions that contain triethylamineborane corresponding to the complex compound represented by the formula (a1) as the impurity diffusion ingredient can realize good diffusion of impurities even when the thickness of the coating film is small.

Examples 9 and 10

The diffusion agent composition used in Example 2 was coated on a silicon substrate that is rectangular in section and has, on a surface thereof, a line-and-space structure with lines having a width of 100 nm and a height of 100 nm provided repeatedly at a line-to-line spacing of 60 nm to form a 3 nm-thick coating film. After the formation of the coating film, in Example 9, the surface of the silicon substrate was rinsed with n-butyl acetate, while, in Example 10, rinsing was not carried out.

The cross-section of the silicon substrate after the formation of the coating film was observed under a scanning electron microscope (SEM). SEM observation revealed that, for both Example 9 and Example 10, coating films having a substantially uniform thickness were formed. By contrast, for Example 10 where rinsing was not carried out, the thickness of the coating film was thick at the corner of the bottom in the spaces and no edge was observed at the corner of the bottom. On the other hand, for Example 9 where rinsing was carried out, edge was clearly observed at the corner of the bottom in the spaces, demonstrating that the thickness of the coating film was uniform even at the surface of the space portion. That is, the thickness of the coating film can be made more uniform by rinsing after the formation of the coating film.

What is claimed is:

1. A diffusion agent composition comprising:
an impurity diffusion ingredient (A); and
a Si compound (B), wherein
the impurity diffusion ingredient (A) contains a complex compound represented by the following formula (a1):

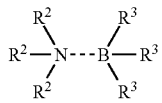

(a1)

wherein $R^2$ represents a group selected from a hydrogen atom and an organic group; bonding between $R^2$ and a nitrogen atom is H—N bond or C—N bond, provided that a plurality of $R^2$s may be the same or different; and $R^3$ represents a group selected from a hydrogen atom, organic groups, and halogen atoms, provided that a plurality of $R^3$s may be the same or different, and
the Si compound (B) is hydrolyzable to produce a silanol group.

2. The diffusion agent composition according to claim 1, wherein, in the formula (a1), all of the $R^2$s represent an optionally substituted alkyl group having 1 to 6 carbon atoms.

3. The diffusion agent composition according to claim 1, wherein, in the formula (a1), all of the $R^3$s represent a hydrogen atom.

4. The diffusion agent composition according to claim 1, wherein the Si compound (B) is represented by the following formula (b1):

$$(R^1)_{4-n}Si(NCO)_n \qquad (b1)$$

wherein $R^1$ represents a hydrocarbon group; and n is an integer of 3 or 4.

5. The diffusion agent composition according to claim 1, further comprising an organic solvent (S).

6. The diffusion agent composition according to claim 1, wherein the number of moles of boron element contained in the impurity diffusion ingredient (A) is 0.01 to 5 times the number of moles of Si contained in the hydrolyzable silane compound (B).

7. The diffusion agent composition according to claim 1, wherein the content of the complex compound represented by the formula (a1) in the impurity diffusion ingredient (A) is not less than 10% by mole, based on the total amount of the impurity diffusion ingredient (A) being 100% by mole.

* * * * *